(12) United States Patent
Oshio

(10) Patent No.: US 7,256,578 B2
(45) Date of Patent: Aug. 14, 2007

(54) MAGNETIC RESONANCE IMAGING SYSTEM

(75) Inventor: Koichi Oshio, Tokyo (JP)

(73) Assignee: Keio University, Tokyo (JP)

( * ) Notice: Subject to any disclaimer, the term of this patent is extended or adjusted under 35 U.S.C. 154(b) by 0 days.

(21) Appl. No.: 11/712,911

(22) Filed: Mar. 2, 2007

(65) Prior Publication Data

US 2007/0159174 A1    Jul. 12, 2007

Related U.S. Application Data

(63) Continuation of application No. PCT/JP05/06152, filed on Mar. 30, 2005.

(30) Foreign Application Priority Data

Dec. 16, 2004    (JP)    ............................. 2004-364765

(51) Int. Cl.
    *G01V 3/00*    (2006.01)
(52) U.S. Cl. ...................... 324/306; 600/413
(58) Field of Classification Search ................ 324/306, 324/307, 309; 600/413, 428, 410
    See application file for complete search history.

(56) References Cited

U.S. PATENT DOCUMENTS 5,031,624 A * 7/1991 Mistretta et al. ............ 600/419
5,677,627 A 10/1997 Rasche
6,838,879 B2 * 1/2005 Kouwenhoven ............ 324/309
7,176,684 B2 * 2/2007 Patch et al. ................. 324/307
2003/0060698 A1 3/2003 Mistretta

FOREIGN PATENT DOCUMENTS

| JP | 5-245128 | 9/1993 |
| JP | 8-182663 | 7/1996 |
| JP | 2000-60820 | 2/2000 |
| JP | 2004-57226 | 2/2004 |
| WO | WO 2000/06245 | 2/2000 |
| WO | WO 2003/027701 | 4/2003 |

* cited by examiner

*Primary Examiner*—Louis M. Arana
(74) *Attorney, Agent, or Firm*—Baker & Hostetler LLP

(57) ABSTRACT

A magnetic resonance imaging system includes a high-frequency magnetic field generating unit for generating and applying a high-frequency magnetic field to a subject placed in a static magnetic field, a gradient magnetic field generating unit for generating a gradient magnetic field to be superimposed on the static magnetic field, and a sequencer for controlling the high-frequency magnetic field generating unit and the gradient magnetic field generating unit to acquire, within a specified part of the heartbeat of the subject, MR data that pertains to a plane through which an axis substantially identical to the body axis of the subject in a k-space extends, and to cause the plane to rotate, at every heartbeat, about the axis substantially identical to the body axis.

8 Claims, 5 Drawing Sheets

MAGNETIC RESONANCE IMAGING SYSTEM

CROSS-REFERENCE TO RELATED APPLICATIONS

This is a Continuation Application of PCT Application No. PCT/JP2005/006152, filed Mar. 30, 2005, which was published under PCT Article 21(2) in Japanese.

This application is based upon and claims the benefit of priority from prior Japanese Patent Application No. 2004-364765, filed Dec. 16, 2004, the entire contents of which are incorporated herein by reference.

BACKGROUND OF THE INVENTION

1. Field of the Invention

The present invention relates to a magnetic resonance imaging system which images a coronary artery.

2. Description of the Related Art

Although coronary artery angiography using a CT including multiple rows of detectors, as many as 64 rows or more, i.e., a so-called MDCT (multi-detector row CT), has recently become popular, this examination method poses problems, e.g., a relatively high radiation dose and the use of a contrast medium. In a similar method using magnetic resonance imaging (MRI), there is no need to consider a radiation dose and there is no need to use any contrast medium. In addition, since MRI allows to simultaneously perform examination on myocardial blood flow information and the like, demands have arisen for the development of coronary artery MRA (MR angiography) using MRI.

The current mainstream method is called the navigator echo method (see patent reference 2). This method operates as follows. The motion of the heart itself and motion caused by respiration mainly pose problems in obtaining the image information of the heart. With the speed of MRI at present, it is difficult to obtain a high-resolution image which allows estimation of a coronary artery in several tens of seconds. It is therefore necessary to remove the influences of these two motions.

In order to remove the influence of the motion of the heart of the two motions, this method generally acquires data only for several tens of msec in synchronism with an ECG (electrocardiogram). In order to remove the influence of the respiratory motion, the method acquires one-dimensional MR data from a rod-like portion perpendicular to the diaphragm immediately before the acquisition of the above data and acquires heart data only in the interval during which the position of the diaphragm which is obtained from the acquired data is located in a predetermined range.

As described above, the navigator echo method acquires data only when both a cardiac cycle and a respiratory cycle exist in a predetermined range, and hence is extremely low in data acquisition efficiency in terms of time. Although various techniques like those disclosed in patent references 1 and 3 have been proposed, any of the techniques has not yet solved the problem of low data acquisition efficiency in terms of time.

patent reference 1: Jpn. Pat. Appln. KOKAI Publication No. 2000-60820 patent reference 2: Jpn. Pat. Appln. KOKAI Publication No. 2004-57226 patent reference 3: International Publication WO00/06245 brochure

BRIEF SUMMARY OF THE INVENTION

It is an object of the present invention to reduce the influence of the motion of the heart and motion caused by respiration and improve the data acquisition efficiency in terms of time in a magnetic resonance imaging system which images a coronary artery.

According to an aspect of the present invention, there is provided a magnetic resonance imaging system comprising, a high-frequency magnetic field generating unit for generating and applying a high-frequency magnetic field to a subject placed in a static magnetic field, a gradient magnetic field generating unit for generating a gradient magnetic field to be superposed on the static magnetic field, and a control unit for controlling to the high-frequency magnetic field generating unit and the gradient magnetic field generating unit to acquire, within a specified part of the heartbeat of the subject, MR data that pertains to a plane through which an axis substantially identical to the body axis of the subject in a k-space extends, and to cause the plane to rotate, at every heartbeat, about the axis substantially identical to the body axis.

DETAILED DESCRIPTION OF THE INVENTION

An embodiment of the present invention will be described below with reference to the views of the accompanying drawing.

Figure 1:
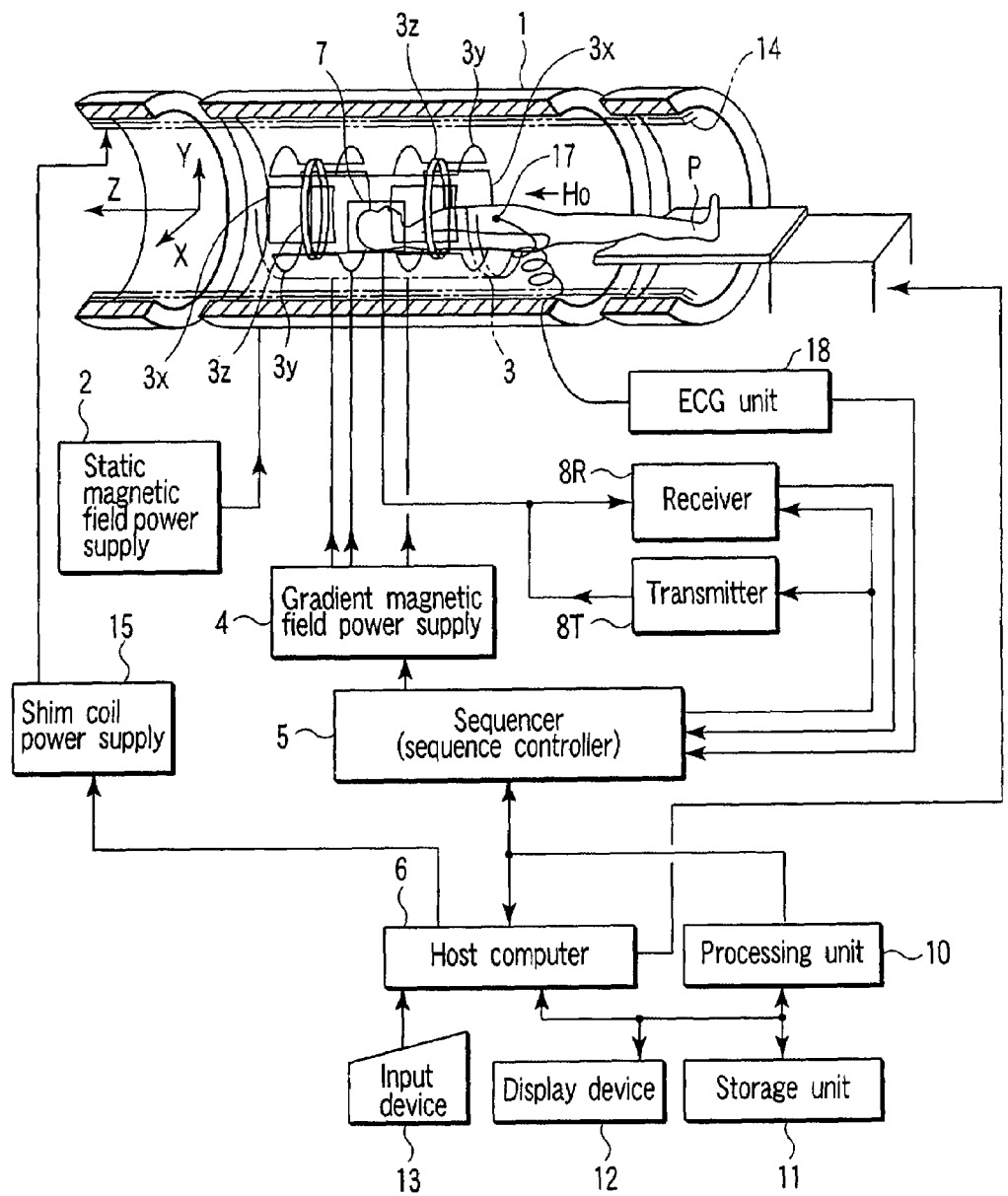
FIG. 1 is a view showing the arrangement of a magnetic resonance imaging apparatus according to an embodiment of the present invention.

FIG. 1 shows the schematic arrangement of a magnetic resonance imaging system according to this embodiment. This magnetic resonance imaging system includes a magnetic unit 1 having a cylindrical opening portion (diagnosis space). The magnetic unit 1 receives a current supplied from a static magnetic field power supply 2 and generates a static magnetic field H0 in the opening portion in the Z-axis direction. Typically, the body axis of a subject P inserted in the opening portion almost coincides with the Z-axis. The magnetic unit 1 comprises a shim coil 14. The shim coil 14 receives a current supplied from a shim coil power supply 15 and generates a correction magnetic field for making a static magnetic field uniform. The magnetic unit 1 houses a gradient magnetic field coil unit 3. The gradient magnetic field coil unit 3 comprises three x, y, and z coils 3x to 3z for generating gradient magnetic fields for changing the magnetic field strength along the orthogonal X-, Y-, and Z-axes. The x, y, and z coils 3x to 3z separately receive currents supplied from a gradient magnetic field power supply 4 and generate gradient magnetic fields corresponding to the X-, Y-, and Z-axes. Controlling pulse currents supplied from the gradient magnetic field power supply 4 to the x, y, and z coils 3x to 3z makes it possible to arbitrarily set a phase encoding direction gradient magnetic field Gpe and a frequency encoding direction (read-out direction) gradient magnetic field Gro by arbitrarily combining gradient magnetic fields in the X-, Y-, and Z-axes.

A gradient magnetic field coil unit 3 houses a high-frequency magnetic field coil (RF coil) 7. A transmitter 8T connects to the RF coil 7 at the time of transmission of a high-frequency magnetic field. A receiver 8R connects to the RF coil 7 at the time of reception of an MR signal. The transmitter 8T supplies an RF current pulse with a Larmor frequency for exciting magnetic resonance (NMR) to the RF coil 7. The receiver 8R receives the MR signal (high-frequency signal) received by the RF coil 7, and performs various kinds of signal processing for the received signal to form corresponding digital data.

A sequencer (also called a sequence controller) 5 controls a series of operations of the gradient magnetic field power supply 4, transmitter 8T, and receiver 8R in accordance with information about a pulse sequence which is sent from a host computer 6. This executes a pulse sequence to be described later. Pulse sequence information is information required to operate the gradient magnetic field power supply 4, transmitter 8T, and receiver 8R. This information includes, for example, information associated with the waveform and application timing of a current supplied to the RF coil 7, and the waveforms and application timings of pulse currents applied to the x, y, and z coils 3x to 3z. The sequencer 5 receives digital data (MR signal) output from the receiver 8R, and transfers the data to a processing unit 10.

The processing unit 10 receives the digital data (MR data) of an MR signal sent from the receiver 8R through the sequencer 5, and executes signal processing to be described later. A storage unit 11 stores MR data, image data, and the like. A display device 12 mainly displays an image. This system includes an ECG sensor 17 together with an ECG unit 18. The ECG sensor 17 is attached to the body surface of the subject P to detect the cardiac motion of the subject as an electrocardiogram signal. The ECG unit 18 performs various kinds of processing including digitization processing for the electrocardiogram signal and outputs the resultant signal to the host computer 6 and the sequencer 5.

Figure 2:
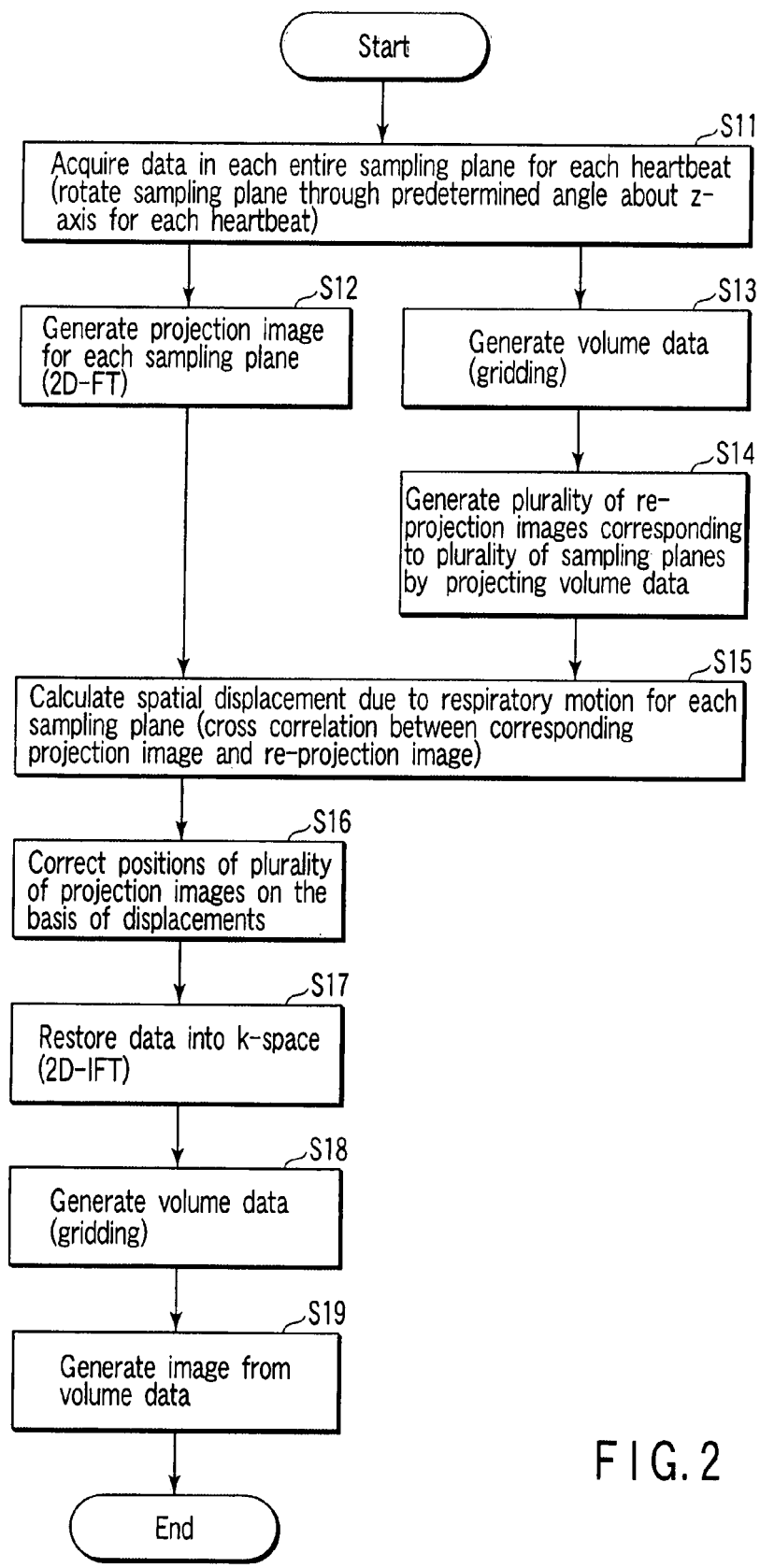
FIG. 2 is a flowchart showing a processing procedure in this embodiment.

The operation of this embodiment will be described next. FIG. 2 shows the flow of operation according to the embodiment. First of all, the process performs data acquisition with respect to a three-dimensional area including the heart of the subject P as a target (S11). The Z-axis parallel to the direction of a static magnetic field substantially coincides with the body axis of the subject P and further with the long axis of the heart. MR data additionally includes position information as phase information and frequency information in accordance with a two-dimensional Fourier transform method (2D-FT). A two-dimensional plane defined by a phase axis and a frequency axis at the time of data acquisition will be referred to as a sampling plane. For the sake of descriptive convenience, assume that a pulse set for the acquisition of MR data in each entire sampling plane will be referred to as a pulse sequence as a unit. Performing 2D-FT using MR data acquired by a single pulse sequence allows to generate an image in a real space corresponding to a sampling plane.

In this embodiment, the system excites a three-dimensional area including the heart of the subject having a width along the Z-axis, performs phase encoding along the Z-axis, and performs frequency encoding along the X- and Y-axes or the combined axis thereof. This embodiment acquires MR data from a sampling plane including the body axis of the subject P instead of a sampling plane perpendicular to the body axis of the subject P as in the prior art. Even confining the number of phase encoding steps to 64 with respect to the number of MR signals sampled, i.e., 256, makes it possible to image a heart area with a sufficient spatial resolution.

Figure 3:
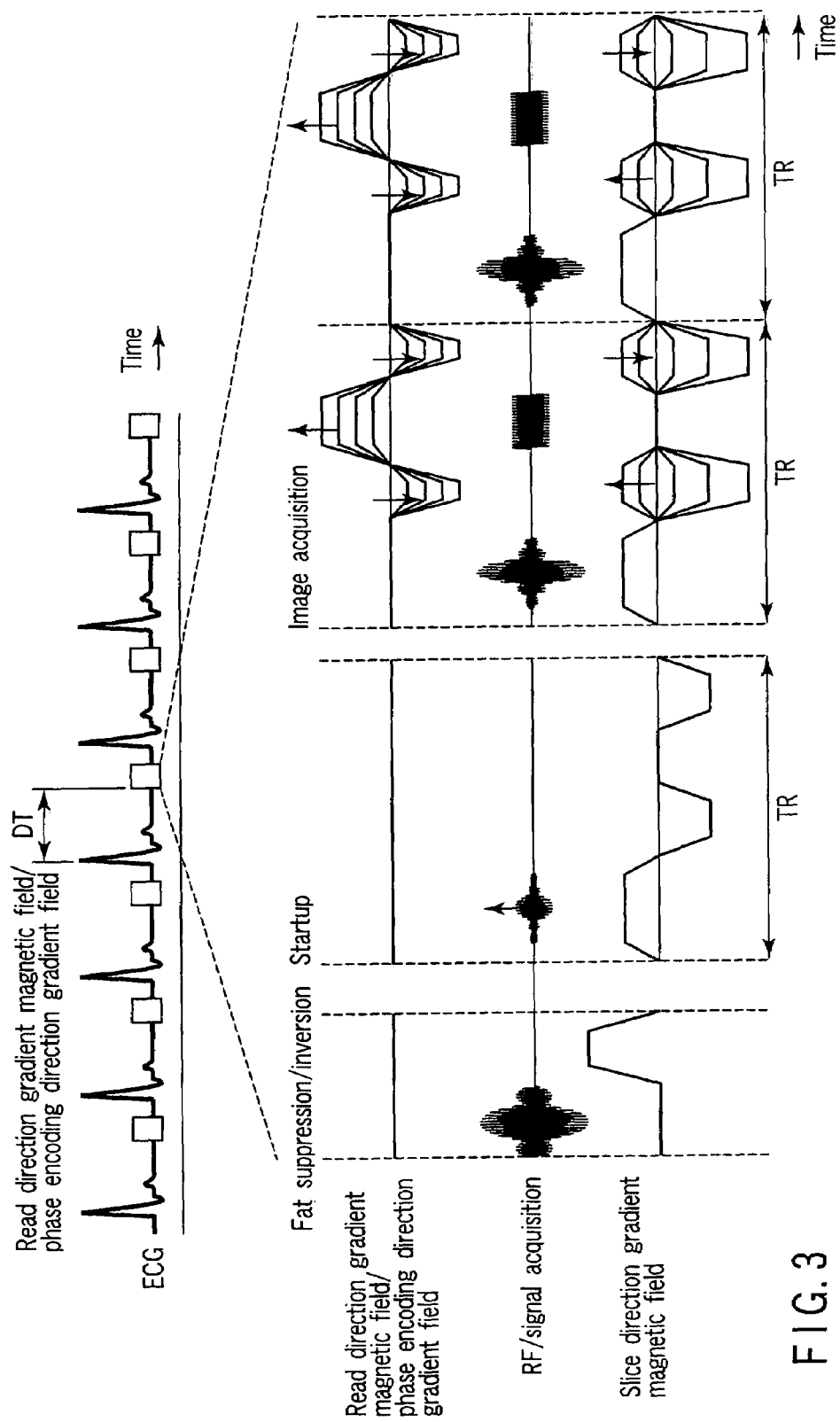
FIG. 3 is a view showing an example of a pulse sequence according to this embodiment.

FIG. 3 shows a typical pulse sequence in this embodiment. The pulse sequence includes, as pre-sequences, a fat suppression (Fat SAT) sequence for saturating a fat spin before data acquisition and a startup sequence for suppressing echo vibration before a steady state. This system uses, as a pulse sequence, an arbitrary MRA pulse sequence for imaging a coronary artery. In this case, the system uses segmented balanced SSFP (Steady State Free Precession) for high-speed operation. SSFP is a sequence of repeatedly and continuously applying a high-frequency magnetic field pulse to a target in a short period in which the transverse magnetization of most of the target remains, and when the precession response of a spin in the target becomes a steady state, measuring a spin signal based on the precession.

Figure 4:
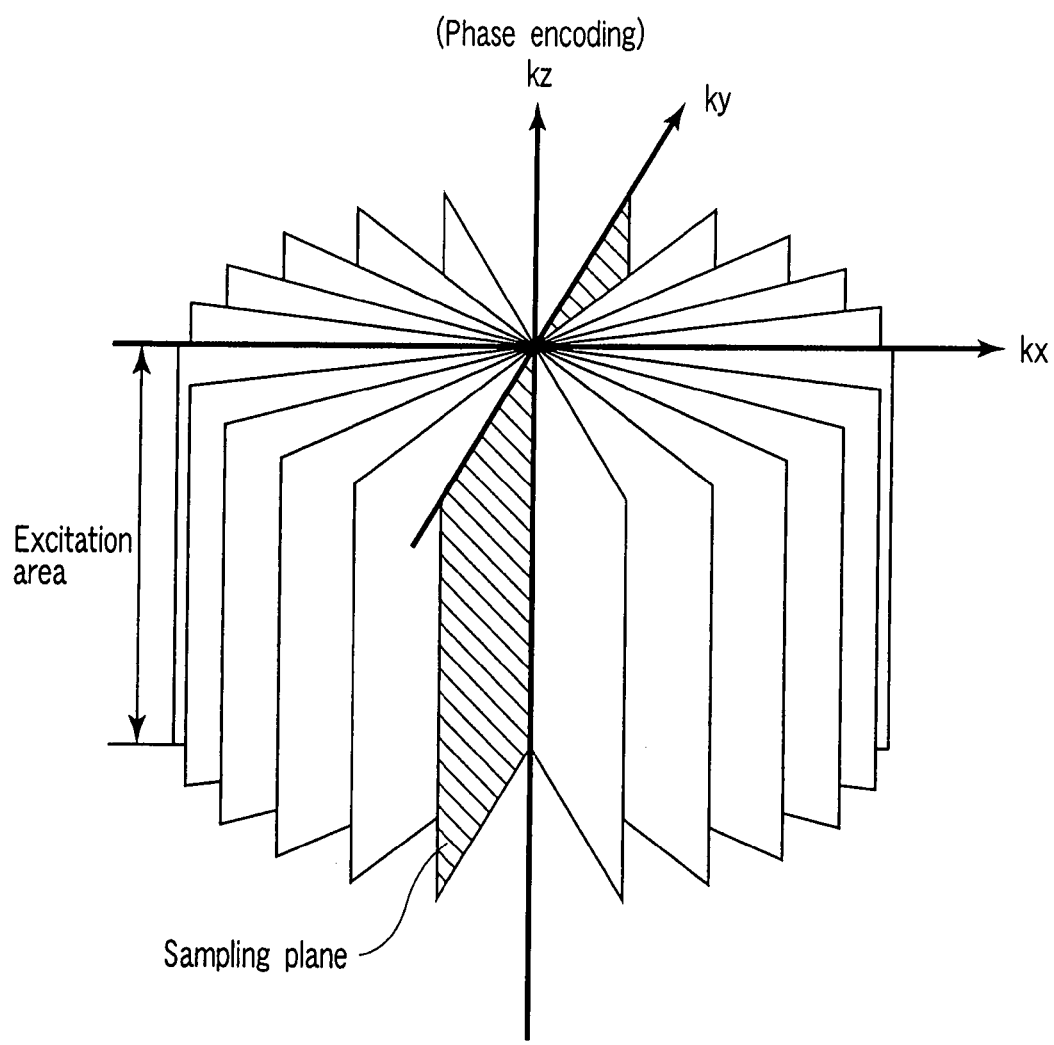
FIG. 4 is a view showing a sampling plane for data acquisition in a specified part of each heartbeat on a three-dimensional k-space according to this embodiment.
Figure 5:
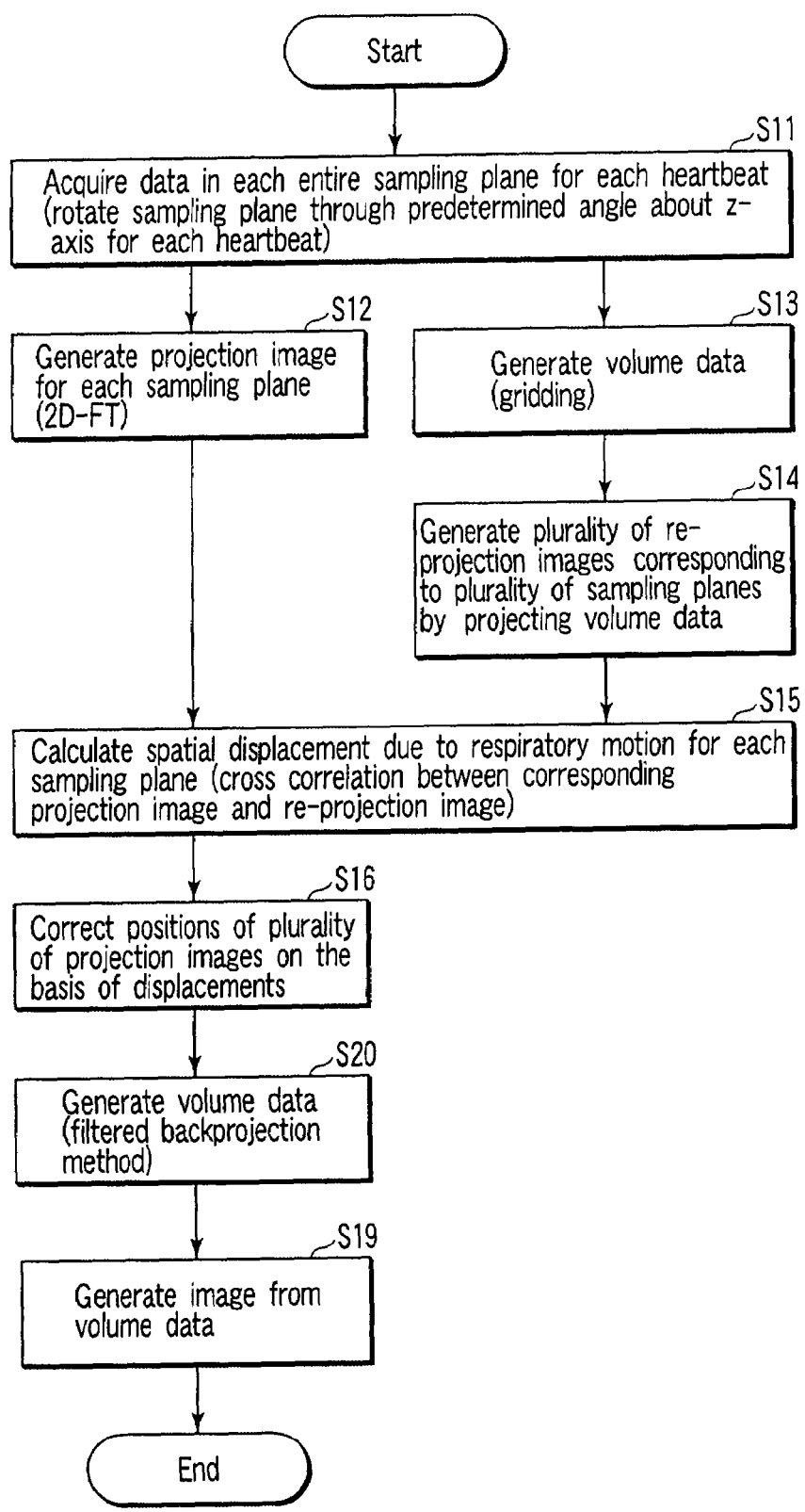
FIG. 5 is a flowchart showing a processing procedure in this embodiment.

The system repeats a pulse sequence in an ECG-gated mode. The system displaces the sampling plane for each heartbeat. That is, a pulse sequence is complete at a specified part of each heartbeat, e.g., end-diastolic, which is defined by a predetermined delay time DT from each R-wave, and is repeated in synchronism with each heartbeat. The sampling plane is moved for each heartbeat. More specifically, as shown in FIG. 4, the system sets a sampling plane to make it pass through the Z-axis (kz-axis) which coincides or almost coincides with the body axis of the subject P in the three-dimensional k-space, and rotates the plane through a predetermined angle about the kz-axis for each heartbeat. The number of sampling planes is set to, for example, 400. With this setting, the system repeats a pulse sequence 400 times while rotating the sampling planes.

The system performs phase encoding by using a Z-axis gradient magnetic field, and performs frequency encoding by using a combination of an X-axis (kx) gradient magnetic field and a Y-axis (ky) gradient magnetic field. The system changes the combining ratio of an X-axis (kx) gradient magnetic field and a Y-axis (ky) gradient magnetic field for frequency encoding with rotation at a predetermined ratio.

The processing unit 10 processes the MR data acquired from the three-dimensional area including the heart of the subject in the above manner, i.e., the MR data of a plurality of sampling planes, in the following manner. First of all, the processing unit 10 generates a plurality of projection images corresponding to the plurality of sampling planes by two-dimensional Fourier transform (S12). Although, the respiratory motion moves on the heart almost along the Z-axis, since the acquisition of MR data of each sampling plane is complete in a very short period of time during one heartbeat, almost no artifacts due to the influences of the cardiac motion and respiratory motion occur in the projection image.

The processing unit 10 performs rearrangement (gridding) of MR data associated with a plurality of sampling planes with different rotational angles around the kz-axis in the three-dimensional k-space at tetragonal lattice points upon interpolation, and performs Fourier transform of the data with respect to the kx-, ky, and kz-axes. The kx- and ky-axes are the frequency encoding axes, and the kz-axis is the phase encoding axis. Fourier transform generates volume data associated with the three-dimensional area (S13).

The processing unit 10 generates a plurality of re-projection images from the generated volume data associated with the three-dimensional area by projection processing (S14). The plurality of re-projection images respectively correspond to the plurality of projection images generated for the respective sampling planes in step S12. The projection direction of each re-projection image is the same or almost the same as that of a corresponding projection image. The position of the heart (coronary artery) remains the same between a plurality of re-projection images with different projection directions because they are generated from the same volume data. This allows the use of each re-projection image as a reference image for specifying the displacement of a corresponding projection image in the Z-axis direction, in particular.

The processing unit 10 specifies (estimates) the displacement (the spatial displacement of the heart due to respiratory motion) of the heart (coronary artery) on each projection image with respect to the reference position of the heart, for each projection image, in the Z-axis direction, in particular, by cross correlation between each projection image and a corresponding reference image (re-projection image) (S15). It suffices to specify not only the displacement of the heart in the Z-axis direction but also the displacement of the heart in a direction perpendicular to the Z-axis.

The processing unit 10 corrects the positions of the respective projection images in accordance with the specified displacements (S16). This uniformly sets the position of the heart in each of the plurality of projection images to the reference position. That is, this eliminates or reduces the displacement of the heart between the plurality of projection images due to respiratory motion. Although shift processing of an image position on the assumption that the heart is a rigid body is typical processing as position correction processing, it suffices to use affine transform processing in consideration of the deformation of the heart accompanying heartbeats in place of the shift processing.

The processing unit 10 restores each projection image from which displacement is eliminated into MR data in a two-dimensional k-space by two-dimensional inverse Fourier transform (S17). The processing unit 10 rearranges the MR data associated with the plurality of sampling planes, which are restored into the k-space, into the three-dimensional k-space at tetragonal lattice points upon interpolation in the same manner as in step S13, and performs Fourier transform of the data with respect to the kz-, ky-, and kz-axes. This generates volume data associated with the three-dimensional area (S18). The processing unit 10 generates an arbitrary slice from the generated volume data or a three-dimensional image by volume rendering or the like (S19).

Note that it suffices to reconstruct volume data associated with a three-dimensional area from the plurality of projection images, from which displacements in different projection directions are eliminated, by, for example, the filtered back projection method, which is one of the X-ray computed tomography methods (X-ray CT) (S20), without restoring the projection images, from which displacements are eliminated, into MR data in the k-space.

Generating an image by using all MR data acquired in the ECG-gated mode in the above manner, i.e., allowing the use of MR data, acquired for image generation, for position correction, makes it unnecessary to separately acquire MR data for position correction and MR data for image generation as in the navigator echo method. This makes it possible to improve the data acquisition efficiency in terms of time.

Note that the present invention is not exactly limited to the above embodiments, and constituent elements can be modified in the execution stage without departing from the spirit and scope of the invention. Various inventions can be formed by properly combining a plurality of constituent elements disclosed in the above embodiments. For example, several constituent elements may be omitted from all the constituent elements described in the embodiments. In addition, constituent elements throughout different embodiments may be properly combined.

The present invention can reduce the influences of the motion of the heart and motion caused by respiration and improve data acquisition efficiency in terms of time in a magnetic resonance imaging apparatus which images a coronary artery.

What is claimed is:

1. A magnetic resonance imaging system comprising:
   a high-frequency magnetic field generating unit for generating and applying a high-frequency magnetic field to a subject placed in a static magnetic field;
   a gradient magnetic field generating unit for generating a gradient magnetic field to be superposed on the static magnetic field; and
   a control unit for controlling to the high-frequency magnetic field generating unit and the gradient magnetic field generating unit to acquire, within a specified part of the heartbeat of the subject, MR data that pertains to a plane through which an axis substantially identical to the body axis of the subject in a k-space extends, and to cause the plane to rotate, at every heartbeat, about the axis substantially identical to the body axis.

2. The magnetic resonance imaging system according to claim 1, further comprising an image generating unit for generating an image of the plane based on the MR data.

3. The magnetic resonance imaging system according to claim 2, wherein the image-generating unit has a position-correcting unit for correcting a position of the image for the plane.

4. The magnetic resonance imaging system according to claim 3, wherein the image-generating unit has a data-reconstructing unit for reconstructing volume data based on the corrected image, by a filtered back projection method.

5. The magnetic resonance imaging system according to claim 3, wherein the image-generating unit has a data-generating unit for transforming the corrected image to k-space data and then generating volume data based on the transformed k-space data by means of Fourier transform.

6. The magnetic resonance imaging system according to claim 3, wherein the image-generating unit has a displacement-determining unit for determining a displacement that the image makes with respect to a reference image.

7. The magnetic resonance imaging system according to claim 6, wherein the image-generating unit has a reference-image generating unit for re-arranging the MR data in a three-dimensional k-space by means of a gridding method, generating volume data based on the re-arranged MR data through Fourier transform, and for re-projecting the generated volume data in directions corresponding to the planes of the image, thereby generating a reference image for the image.

8. The magnetic resonance imaging system according to claim 3, wherein the position-correcting unit includes an affine transformation unit.

* * * * *